United States Patent
Shibata et al.

(10) Patent No.: US 7,420,126 B2
(45) Date of Patent: Sep. 2, 2008

(54) CIRCUIT BOARD AND CIRCUIT APPARATUS USING THE SAME

(75) Inventors: Kiyoshi Shibata, Ogaki (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 185 days.

(21) Appl. No.: 11/511,496

(22) Filed: Aug. 29, 2006

(65) Prior Publication Data

US 2007/0044999 A1  Mar. 1, 2007

(30) Foreign Application Priority Data

Aug. 30, 2005  (JP) ............................. 2005-250369

(51) Int. Cl.
 *H05K 1/03* (2006.01)
(52) U.S. Cl. ...................... 174/255; 174/252; 174/262; 174/263; 174/264; 174/265; 361/792; 361/793; 361/794; 361/795
(58) Field of Classification Search ................. 174/255, 174/252, 262–264, 260; 361/792–795
See application file for complete search history.

(56) References Cited

U.S. PATENT DOCUMENTS

| | | | | |
|---|---|---|---|---|
| 6,143,116 | A * | 11/2000 | Hayashi et al. ............. | 156/233 |
| 6,623,844 | B2 * | 9/2003 | Nishimoto ................. | 428/209 |
| 7,317,166 | B2 * | 1/2008 | Nakamura .................. | 174/262 |
| 2007/0023202 | A1 * | 2/2007 | Shibata et al. .............. | 174/250 |

FOREIGN PATENT DOCUMENTS

JP  2002-335057  11/2002

* cited by examiner

*Primary Examiner*—Jeremy C. Norris
*Assistant Examiner*—Xiaoliang Chen
(74) *Attorney, Agent, or Firm*—McDermott Will & Emery LLP

(57) ABSTRACT

A circuit board and a circuit apparatus using the same are provided, which have an improved heat radiation capability near through holes piercing through its metal substrate so as to address a requirement as to heat radiation capability. The circuit apparatus has the circuit board in which a metal substrate having pierced holes is formed as a core member. Protrusions are formed at the top ends of the pierced holes, and round corners are formed at the bottom ends of the same. Insulating layers are formed on both sides of the metal substrate, and wiring pattern layers are formed on the respective insulating layers. The insulator formed on one side of the metal substrate and the insulator formed on the other side of the metal substrate are extended to inside the pierced holes. The joining surface between the extended portions is shifted off the center position of the metal substrate in the thickness direction, toward the same side as where the protrusions are formed. In order to electrically connect the wiring pattern layers, a conductor layer connecting the wiring layers is formed through the metal substrate via the pierced holes, thereby establishing conduction between the wiring layers. A semiconductor chip is connected directly to the top side of the circuit board via solder balls.

12 Claims, 11 Drawing Sheets

50

50A

50B

50C

CIRCUIT BOARD AND CIRCUIT APPARATUS USING THE SAME

BACKGROUND OF THE INVENTION

1. Field of the Invention

The invention relates to a circuit board and a circuit apparatus using the same. In particular, the invention relates to a circuit board having a substrate consisting primarily of metal as a core member, and a circuit apparatus using the same.

2. Description of the Related Art

While portable electronics equipment including cellular phones, PDAs, DVCs, and DSCs are rapidly becoming more functionally sophisticated, miniaturization and weight savings have become essential in order for these products to be accepted in the market. To achieve this, more highly integrated system LSIs have become sought after. In the meantime, enhanced usability and convenience are also desirable features of such electronics equipment, and increased functional and performance sophistication have therefore been required of the LSIs intended for use in such equipment. Consequently, while the highly integrated LSI chips have facilitated the implementation of a greater numbers of I/Os, miniaturization of the packages themselves has now become imperative. In order to satisfy both of these requirements, there has been a strong demand to develop a semiconductor package suited to packaging semiconductor parts on a board at a higher density. To meet this demand, various types of packaging technologies called CSP (Chip Size Package) have been developed.

Among the known examples of such packages is a BGA (Ball Grid Array). With the BGA, semiconductor chips are mounted on a packaging substrate and molded with resin. Then, solder balls are formed over an area on the other side of the substrate as external terminals. Since the BGA realizes a planar mounting area, it is relatively easy to miniaturize the package. Therefore, the circuit boards need not be designed in narrower pitches, and do not require high-precision mounting technologies. The BGA can thus be used to reduce the total packaging cost, even if the package itself is of a relatively high cost.

FIG. 9 is a diagram showing the general configuration of a typical BGA. The BGA 100 has a structure where an LSI chip 102 is mounted on a glass epoxy substrate 106 via an adhesive layer 108. The LSI chip 102 is molded with sealing resin 110.

The LSI chip 102 and the glass epoxy substrate 106 are electrically connected with metal wires 104. An array of solder balls 112 are formed on the back side of the glass epoxy substrate 106. Through these solder balls 112, the BGA 100 is mounted on a printed wiring board.

In recent years, semiconductor packages (circuit apparatuses) to be incorporated in electronic equipment and the like have required greater miniaturization, higher densities, and increased functionality. The circuit apparatuses have thus grown in heat generation density per unit volume. Such increases in the heat generation density can cause adverse effects on the performance and reliability of the circuit apparatuses, thereby causing significant problems. For this reason, metal substrates and the like having high radiation performance have been used as circuit boards for constituting the circuit apparatuses, instead of the glass epoxy substrate 106. Furthermore, in order to conduct heat to the metal substrates efficiently, resins that contain alumina and other fillers having high thermal conductivities are used to make the insulating layers that constitute the circuit apparatuses. The heat radiation capabilities of the entire circuit apparatuses are therefore enhanced by these means.

FIG. 10 is a sectional view schematically showing the structure of a conventional circuit apparatus disclosed in Japanese Patent Laid-Open Publication No. 2002-335057. With reference to FIG. 10, the circuit board 210 for constituting a conventional circuit apparatus 200 includes a metal substrate 201 as a core member thereinside. Wiring pattern layers 203 and 205 are formed on both sides of the metal substrate 201 via resin insulating layers 202 and 204. For electrical connection between the layers, through apertures called through holes 206 are formed in the thickness direction. The inner surfaces of the through holes are plated with copper or the like, thereby forming an electrical conduction layer 207 for layer-to-layer conduction. In addition, a semiconductor chip 220 is directly connected to one side of the circuit board 210 via solder balls 221.

Resins containing no filler have thermal conductivities of approximately 2 W/(m·K). Filler-containing resins typically have thermal conductivities of approximately 10 W/(m·K), depending on such factors as the thermal conductivity of the filler itself, and the content of the filler. Consider the instance where that a filler-containing resin is used as the internal insulating layers of the metal substrate. The resin insulating layers 202 and 204 are then formed with the metal substrate 201 therebetween, or on the top and bottom surfaces of the same, by thermocompression under vacuum or reduced pressure. In this instance, the resin insulating layers 202 and 204 flow into and fill the through holes 206 from the top and bottom surfaces, respectively.

FIG. 11 is an enlarged sectional view of the circuit apparatus of FIG. 10, showing the vicinity of a through hole in the circuit board. It should be appreciated that the broken line in FIG. 11 indicates the center position (CA) of the metal substrate in the thickness direction.

Since the resin insulating layers 202 and 204 flow into and fill the interior of the through hole 206 from the top and bottom surfaces of the metal substrate 201 at the same time, the joining surface between the resin insulating layers 202 and 204 generally coincides with the center position (CA) of the metal substrate 201 in the thickness direction. While these resin insulating layers are flowing, their resin component and accompanying filler move at different rates of mobility (the mobility of the filler is lower than that of the resin component). The resin inside the through hole 206 thus has areas 202a and 204a where the content of the filler (filler concentration) is lower. Since these areas 202a and 204a have filler concentrations lower than that of the resin insulating layers lying outside the through hole 206, the surrounding areas including the through hole 206 are low in thermal conductivity and low in heat radiation capability.

SUMMARY OF THE INVENTION

The present invention has been developed in view of the foregoing circumstances. It is therefore an object of the present invention to provide a circuit board that has filler-containing insulating layers, and has an improved heat radiation capability near through holes piercing through its metal substrate so as to address the requirement of heat radiation capability, and a circuit apparatus using the same.

To solve the foregoing problems, a circuit board according to one of the aspects of the present invention includes: a substrate having a pierced hole; a first wiring layer formed on one side of the substrate via a first insulating layer containing an insulator and a filler having a thermal conductivity higher than that of the insulator; a second wiring layer formed on the other side of the substrate via a second insulating layer having the same composition as that of the first insulating layer; a conductor layer piercing through the substrate via the pierced hole, thereby establishing connection between the first wiring layer and the second wiring layer; and a protrusion formed on the one side of the substrate along an end of the pierced hole. A joining surface between the first insulating layer and the second insulating layer in the pierced hole is shifted toward the same side as where the protrusion is formed.

According to this aspect, the flow of the first insulating layer into the pierced hole is suppressed because of the protrusion formed along the end of the pierced hole. The joining surface between the first insulating layer and the second insulating layer in the pierced hole is thus shifted toward the same side as where the protrusion is formed. Since this suppressed flow of the first insulating layer reduces the difference between the amount of movement of the resin component and that of the accompanying filler, the resin inside the pierced hole has a filler concentration higher than in conventional cases without the suppression. This means an improved heat radiation capability on the side where the protrusion is formed (the one side of the substrate). As a result, it is possible to obtain a circuit board having an improved heat radiation capability on the one side of the substrate, so that heat can be radiated effectively when circuit elements, or heat sources, are mounted on the one side of the substrate.

In the foregoing configuration, the substrate may also have a pierced hole having no protrusion.

According to another aspect, the circuit board is characterized in that the substrate further has a pierced hole having a protrusion on the other side of the substrate. According to this aspect, the areas of the substrate where the pierced holes having a protrusion are formed can be selectively improved in heat radiation capability. Thus, when circuit elements are mounted on the corresponding areas on the one side and the other side of the circuit board, the resulting circuit apparatus provides a superior heat radiation efficiency as compared to the cases where the circuit elements are mounted on a circuit board having no protrusion.

According to yet another aspect, the circuit board is characterized in that the substrate further has a round corner on the other side of the pierced hole having a protrusion, the round corner being formed along the end of the pierced hole. This promotes the flow of the second insulating layer, whereby the position of the joining surface between the first insulating layer and the second insulating layer in the pierced hole is shifted further toward the one side of the substrate. Consequently, the flow of the first insulating layer is suppressed more, and the proportion of the filler contained in the first insulating layer inside the pierced hole increases. This improves the heat radiation capability on the one side of the substrate when compared to the cases where the joining surface is not shifted. As a result, it is possible to provide a circuit board having a yet more improved heat radiation capability.

According to yet another aspect, the circuit board is characterized in that a filling rate of the filler in the first wiring layer inside the pierced hole is higher than that of the filler in the second wiring layer inside the pierced hole.

A circuit apparatus according to yet another aspect of the present invention comprises the foregoing circuit board and a circuit element mounted on the circuit board, the circuit element being arranged on the first wiring layer which is formed on the same one side as the protrusion is. In this configuration, heat occurring from the circuit element is conducted to the metal substrate from the one side of the substrate that has an improved heat radiation capability. It is therefore possible to provide a circuit apparatus having a high heat radiation capability.

A circuit board according to yet another aspects of the present invention includes: a substrate having a pierced hole; a first wiring layer formed on one side of the substrate via a first insulating layer containing an insulator and a filler having a thermal conductivity higher than that of the insulator; a second wiring layer formed on the other side of the substrate via a second insulating layer having the same composition as that of the first insulating layer; and a conductor layer piercing through the substrate via the pierced hole, thereby establishing connection between the first wiring layer and the second wiring layer, and wherein a joining surface between the first insulating layer and the second insulating layer in the pierced hole is shifted toward the one side of the substrate where the first insulating layer is formed, and a filling rate of the filler in the first wiring layer inside the pierced hole is higher than that of the filler in the second wiring layer inside the pierced hole.

It is to be noted that any arbitrary combination or rearrangement of the above-described structural components and so forth are all effective as and encompassed by the present embodiments. Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
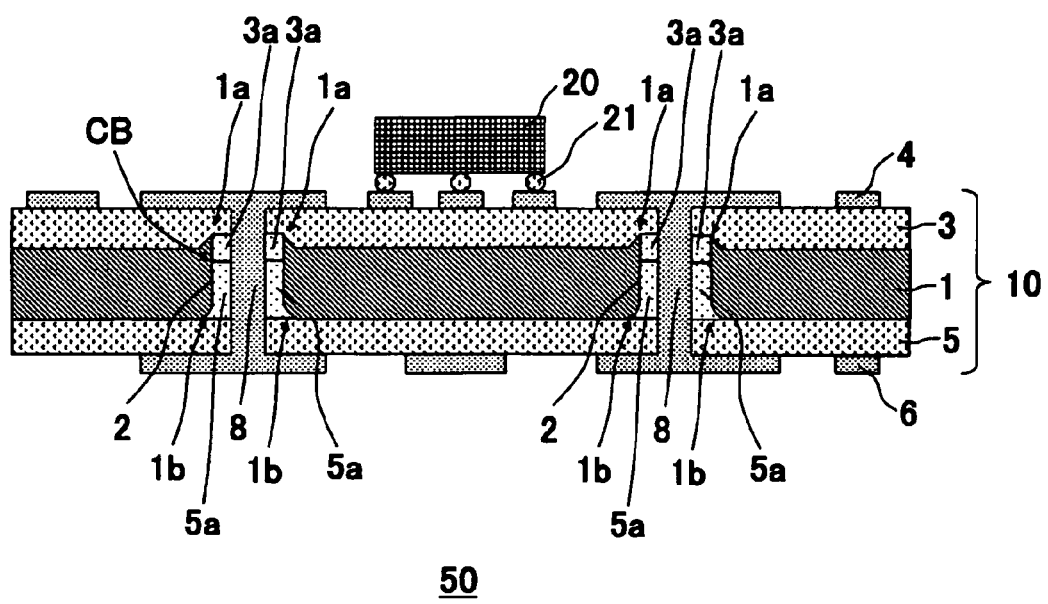
FIG. 1 is a sectional view of a circuit apparatus which has a circuit board including a metal substrate according to a first embodiment of the present invention.

The invention will now be described by reference to the preferred embodiments. This does not intend to limit the scope of the present invention, but to exemplify the invention.

Hereinafter, practical embodiments of the present invention will described with reference to the drawings. It should be appreciated that, in any of the drawings, like components will be designated by identical reference numerals. Descriptions thereof will be omitted as appropriate. As employed herein, the "top" direction shall be defined as a direction in which circuit elements are located with respect to a metal substrate.

First Embodiment

Figure 2:
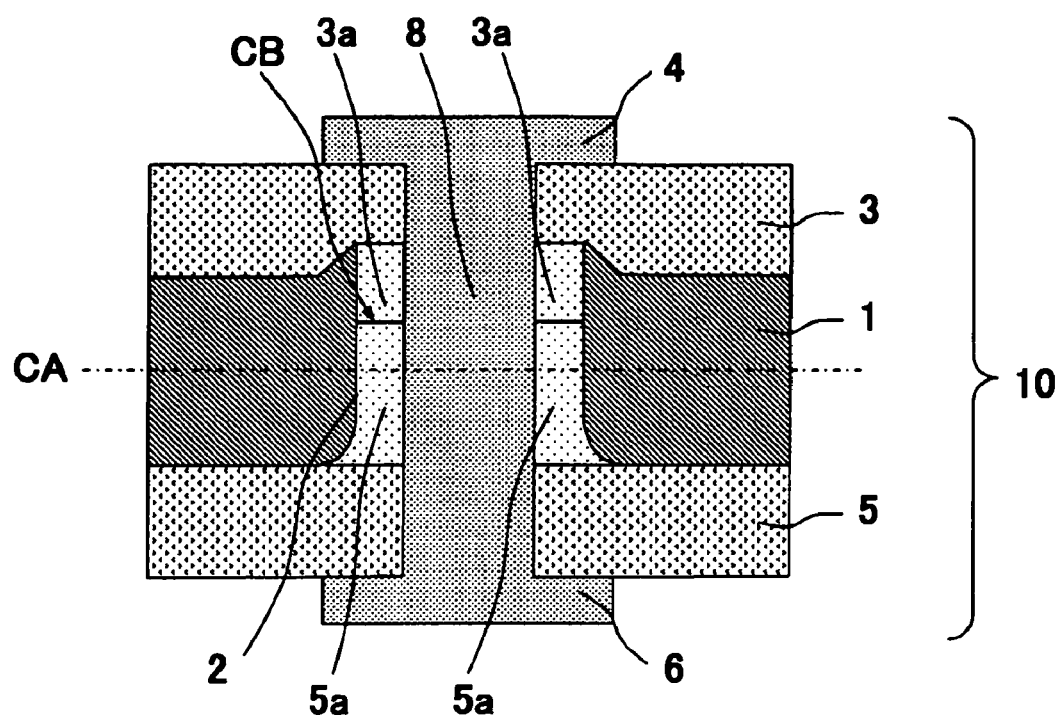
FIG. 2 is an enlarged view near a pierced hole of the metal substrate in FIG. 1.

FIG. 1 is a sectional view of a circuit apparatus which has a circuit board including a metal substrate according to the first embodiment of the present invention. FIG. 2 is an enlarged view near a pierced hole of the metal substrate shown in FIG. 1.

The circuit apparatus 50 according to the first embodiment of the present invention has a circuit board 10, in which a metal substrate 1 having pierced holes 2 is formed as a core member. The metal substrate 1 has protrusions 1a at the top ends of the pierced holes 2, and round corners (depressions) 1b at the bottom ends of the pierced holes 2. Wiring pattern layers 4 and 6 are formed on both sides of this metal substrate 1 via insulating layers 3 and 5, respectively. Insulating layers 3a and 5a are formed inside the pierced holes 2 of the metal substrate 1, with their joining surface CB above the center position of the metal substrate 1 in the thickness direction, or closer to the top side of the pierced holes 2. To provide electrical connection between the wiring pattern layers, a conductor layer 8, for connecting the wiring pattern layer 4 and the wiring pattern layer 6, is formed through the metal substrate 1 via the pierced holes 2. The conductor layer 8 thereby establishes electrical conduction between the wiring pattern layers. A semiconductor chip 20 is directly connected to the top side of the circuit board 10 via solder balls 21.

By way of specific example, in the circuit apparatus 50 in accordance with the first embodiment of the present invention, a metal substrate 1 having a thickness of approximately 50 μm to 1 mm (for example, approximately 100 μm) is used as the core member inside the circuit board 10. In some instances, this metal substrate 1 is made of a cladding material that is formed by laminating the following layers: a lower metal layer of copper; an intermediate metal layer of Fe—Ni alloy (so-called invar alloy), formed on the lower metal layer; and an upper metal layer of copper, formed on the intermediate metal layer. It should be noted that the metal substrate 1 may be made of a single layer of copper.

The metal substrate 1 is irradiated with a laser or drilled so that pierced holes 2 (approximately 300 μm in diameter) piercing through the metal substrate 1 are formed in predetermined locations of the metal substrate 1. This consequently forms the protrusions 1a (approximately 25 μm) at the ends of the pierced holes 2a on the top of the metal substrate 1, and the depressions 1b at the ends of the pierced holes 2 on the bottom of the metal substrate 1. If ten or more pierced holes 2 are formed, for example, in every 100 mm$^2$ of the metal substrate 1, it is possible to improve the heat radiation capability of a circuit board, to be described later, and that of a circuit apparatus using the same.

The insulating layers 3 and 5 on the top and bottom of the metal substrate 1 are made primarily of epoxy resin, with a thickness of approximately 60 to 160 μm (for example, approximately 75 μm). At this time, as will be described later, the pierced holes 2 of the metal substrate 1 are completely filled with the insulating layers 3a and 5a, with their joining surface CB above the center position of the metal substrate 1 in the thickness direction, closer to the top side of the pierced holes 2. A filler of approximately 2 to 10 μm in diameter is added to the insulating layers 3 and 5 that consist primarily of epoxy resin. Among examples of this filler are alumina ($Al_2O_3$), silica ($SiO_2$), aluminum nitride (AlN), silicon nitride ($Si_3N_4$), and boron nitride (BN). The filling rate of the filler is approximately 60% to 80% by weight.

The wiring pattern layers 4 and 6 of copper are formed on the insulating layers 3 and 5 at a thickness of approximately 35 μm. The conductor layer 8 (approximately 150 μm in diameter) establishes electrical conduction between the wiring pattern layers. In this instance, the wiring pattern layer 4 on the top side of the metal substrate has a wiring density higher than that of the wiring pattern layer 6 on the bottom side of the metal substrate. The LSI chip, or semiconductor chip 20, is also connected onto the wiring pattern layer 4 via the solder balls 21.

FIGS. 3A to 5 are sectional views intended to aid explanation of the manufacturing process of the circuit apparatus including the circuit board, in accordance with the first embodiment of the present invention, shown in FIG. 1.

Figure 3A:
FIGS. 3A to 3C are sectional views for explaining the process for manufacturing the circuit apparatus that has the circuit board including the metal substrate according to the first embodiment of the present invention.

Initially, as shown in FIG. 3A, a metal substrate 1, having a thickness of approximately 50 μm to 1 mm (for example, approximately 100 μm), is prepared as a core member. By way of example, the metal substrate 1 is made of a cladding material that is formed by laminating the following layers: a lower metal layer of copper; an intermediate metal layer of Fe—Ni alloy (so-called invar alloy), formed on the lower metal layer; and an upper metal layer of copper, formed on the intermediate metal layer. It should be appreciated that the metal substrate 1 may be made of a single layer of copper.

Figure 3B:
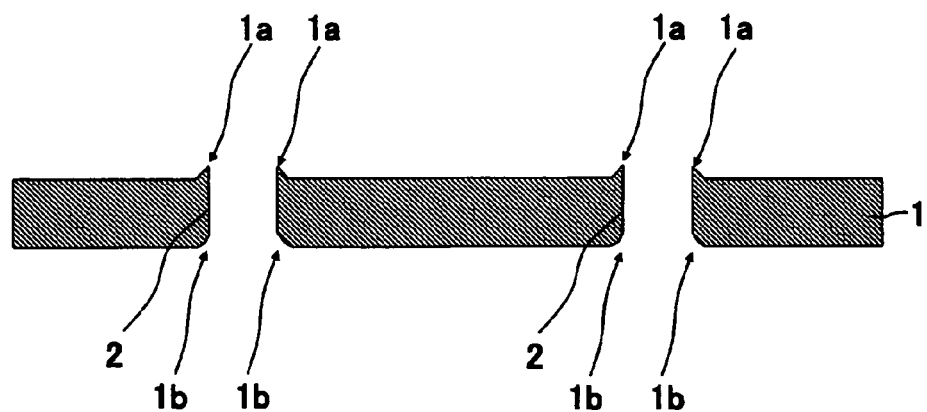

Next, as shown in FIG. 3B, the metal substrate 1 is irradiated with a laser or drilled so that pierced holes 2 (approximately 300 μm in diameter) piercing through the metal substrate 1 are formed in predetermined locations. Consequently, protrusions 1a (approximately 25 μm in height) are formed at the top ends of the pierced holes 2 of the metal substrate 1, and depressions 1b are formed at the bottom ends of the pierced holes 2 of the metal substrate 1. These protrusions 1a are formed on the metal substrate 1 along the ends of the pierced holes 2, and it should be appreciated that the extremities of the protrusions 1a need not be of a uniform height. For example, the protrusions 1a may be formed in a comb-like or wave-like configuration. It should be appreciated that the protrusions need not be identical in shape, either. The heat radiation capability can be efficiently improved if ten or more protrusions 1a (pierced holes 2) are formed, for example, in every 100 mm$^2$ of the metal substrate 1. This makes it possible to provide a circuit board having high heat radiation capability and a circuit apparatus using the same. In this instance, the pierced holes 2 are preferably formed uniformly across the entire area of the metal substrate 1.

Figure 3C:
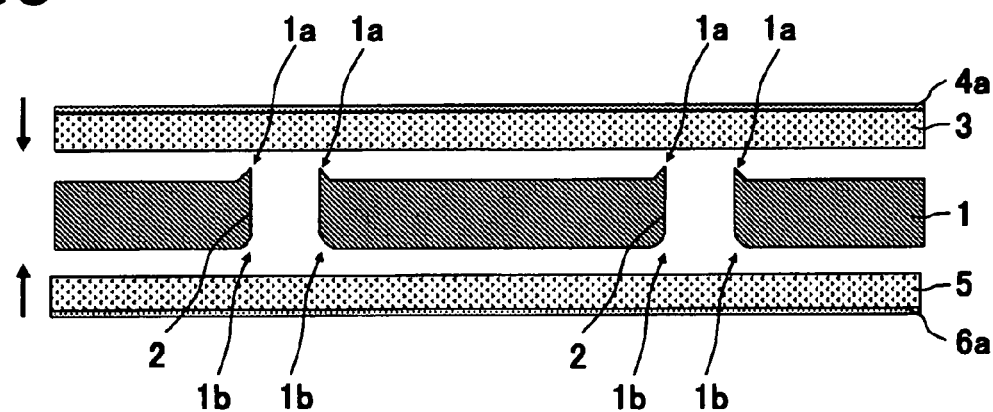

Next, as shown in FIG. 3C, an insulating layer 3 accompanied with a copper foil 4a and an insulating layer 5 accompanied with a copper foil 6a are bonded to the top side and bottom side of the metal substrate 1, respectively, by thermocompression under vacuum or reduced pressure. By way of example, the insulating layers 3 and 5 may have a thickness of about 75 μm, and the copper foils 4a and 6a may have a thickness of about 10 to 15 μm.

Figure 4A:
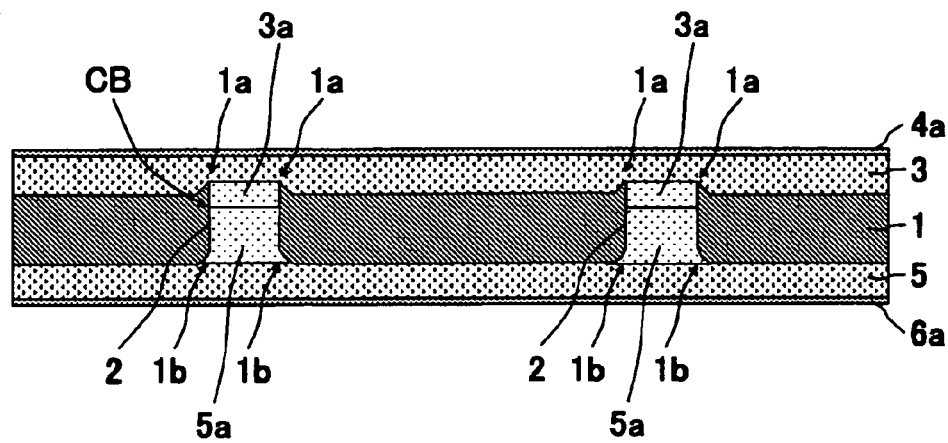
FIGS. 4A to 4C are sectional views for explaining the process for manufacturing the circuit apparatus that has the circuit board including the metal substrate according to the first embodiment of the present invention.

As shown in FIG. 4A, after the compression bonding of the insulating layers accompanied with copper foils, the pierced holes 2 of the metal substrate 1 are completely filled up with the insulating layers 3a and 5a. In this instance, the insulating layers 3 and 5 flow into and fill the interiors of the pierced holes 2 from the top and bottom surfaces of the metal substrate 1 at the same time. Nevertheless, the flow of the insulating layer 3 is suppressed by the protrusions 1a of the pierced holes 2, and the flow of the insulating layer 5 is promoted by the depressions 1b on the other side. This shifts the joining surface CB between the insulating layers 3 and 5 off the center position of the metal substrate 1 in the thickness direction, closer to the top side of the pierced holes 2. This suppressed flow of the insulating layer 3 reduces the difference between the amount of movement of the resin component and that of the accompanying filler. As a result, the content of the filler in the resin inside the pierced holes 2 (filler concentration) becomes relatively high as compared to conventional cases without the suppression. Moreover, the promoted flow of the insulating layer 5 on the other side of the metal substrate 1 increases the difference between the amount of movement of the resin component and that of the accompanying filler. The content of the filler in the resin inside pierced holes 2 (filler concentration) therefore becomes relatively low as compared to the cases without the suppression.

Figure 4B:
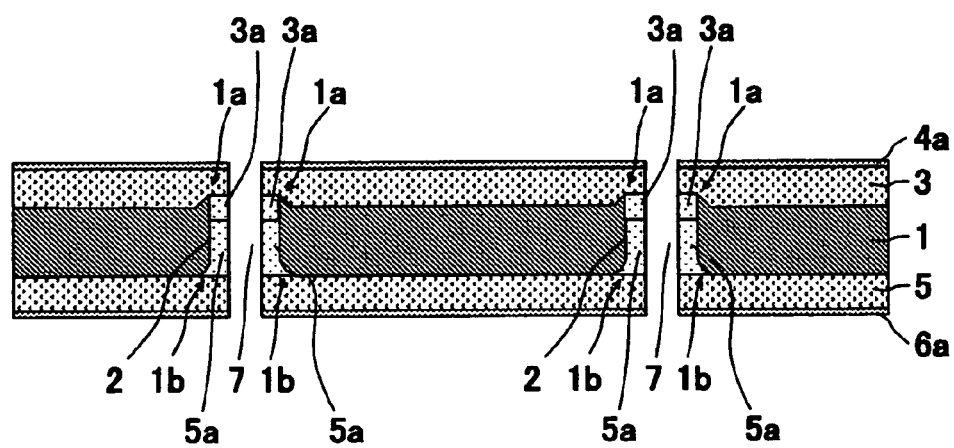

Next, as shown in FIG. 4B, the metal substrate 1 is irradiated with a laser or drilled so that through holes 7 (approximately 150 μm in diameter) for connecting the copper foils on both sides are formed at locations corresponding to the pierced holes 2.

Figure 4C:
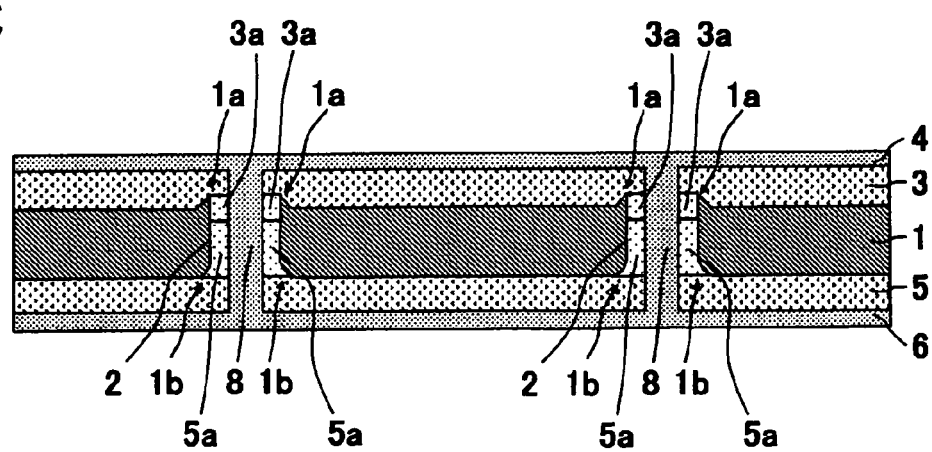

Next, as shown in FIG. 4C, the top surface of the copper foil 4a, the inner surfaces of the through holes 7, and the bottom surface of the copper foil 6a are plated with approximately 0.5 μm of copper by electroless plating. Subsequently, the top surface of the copper foil 4a, the inner surfaces of the through holes 7, and the bottom surface of the copper foil 6a are plated by electrolytic plating. In the first embodiment of the present invention, an inhibitor and a promoter are added to the plating solution so that the inhibitor is absorbed onto the surfaces of the copper foils 4a and 6a while the promoter is absorbed onto the inner surfaces of the through holes 7. This makes it possible to increase the thickness of the copper plating on the inner surfaces of the through holes 7, thereby filling up the through holes 7 with copper. As a result, wiring layers 4 and 6 of copper, having a thickness of approximately 35 μm, are formed on the resin layers 3 and 5, respectively, and the through holes 7 are filled with a conductor layer 8 of copper.

Figure 5:
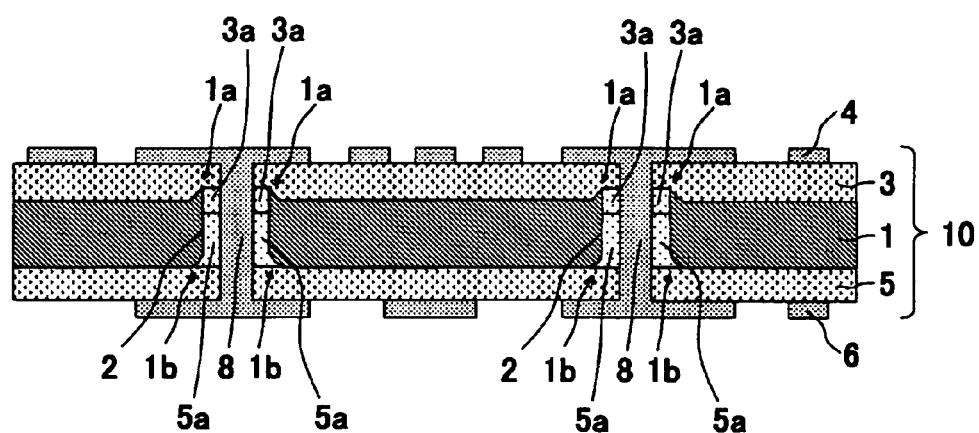
FIG. 5 is a sectional view for explaining the process for manufacturing the circuit apparatus that has the circuit board including the metal substrate according to the first embodiment of the present invention.

Next, as shown in FIG. 5, the wiring layers 4 and 6 are separately patterned using ordinary photolithography and etching techniques. This forms the wiring pattern layer 4 and the wiring pattern layer 6. Consequently, the circuit board 10, which includes the metal substrate 1 having the protrusions 1a, is formed.

Finally, as shown in FIG. 1, the LSI chip 20 is mounted on and electrically connected to the wiring pattern layer 4 of the circuit board 10 via the solder balls 21, and fixed by a resin layer (not shown). As a result, the circuit apparatus 50, having the circuit board 10 including the metal substrate 1, is formed.

According to the first embodiment, the flow of the insulating layer 3a into the pierced holes is suppressed, as described above, because of the protrusions formed along the ends of the pierced holes. The joining surface CB between the insulating layers 3a and 5a inside the pierced holes is thereby shifted toward the same side as where the protrusions 1a are formed (the top side of the pierced holes 2). Since this suppressed flow of the insulating layer 3a reduces the difference between the amount of movement of the resin component and that of the accompanying filler, the resin inside the pierced holes has a filler concentration higher than in conventional cases without the suppression. The heat radiation capability thus improves on the side where the protrusions 1a are formed. Consequently, it is possible to provide a circuit board having an improved heat radiation capability, and to achieve effective heat radiation when circuit elements, or heat sources, are mounted on the side where the protrusions 1a are formed.

Furthermore, according to the first embodiment, the depressions 1b are formed along the pierced hole ends at the bottom side of the pierced holes 2 which have the protrusions 1a. This promotes the flow of the insulating layer 5, whereby the joining surface CB between the insulating layers 3a and 5a inside the pierced holes is shifted further toward the side where the protrusions 1a are formed. Consequently, the flow of the insulating layer 3a is suppressed further, and the proportion of the filler contained in the insulating layer 3a inside the pierced holes increases. This improves the heat radiation capability on the same side as where the protrusions 1a are formed, when compared to the conventional cases where the joining surface is not shifted.

Moreover, according to the first embodiment, the circuit element 20 is arranged on the wiring layer 4, which is formed on the same side as the protrusions 1a are. Since the heat emanating from the circuit element 20 is conducted to the metal substrate 1 efficiently on the top side having an improved heat radiation capability, it is possible to provide a circuit apparatus that has a high heat radiation capability.

Modification of First Embodiment

Figure 6:
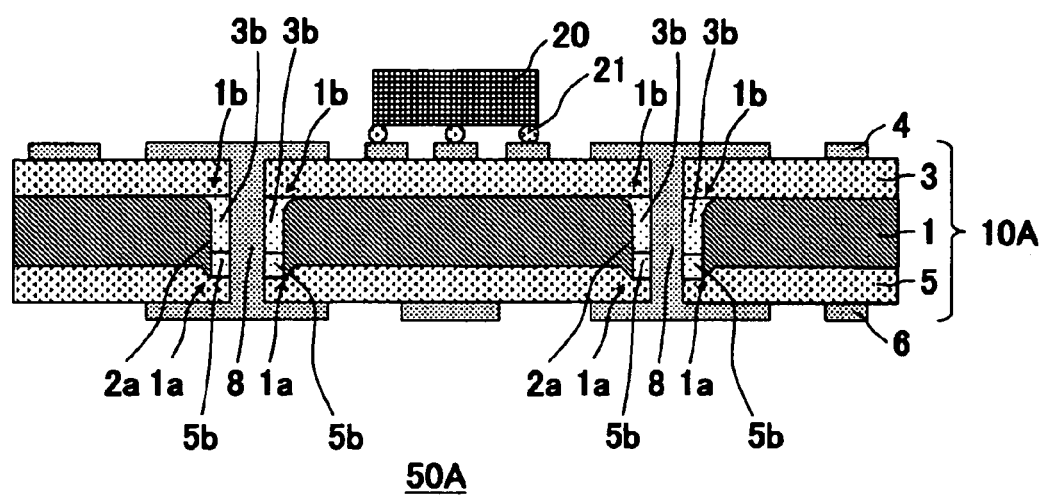
FIG. 6 is a sectional view of a circuit apparatus which has a circuit board including a metal substrate according to a modification of the first embodiment of the present invention.

FIG. 6 is a sectional view showing a circuit apparatus which has a circuit board including a metal substrate according to a modification of the first embodiment of the present invention. In the modification of the first embodiment, protrusions 1a at the ends of the pierced holes 2a of the metal substrate 1 are formed on the bottom side of the pierced holes 2, not on the side where the LSI chip 20 is to be mounted on (the top side of the pierced holes 2). In all other respects, the modification is the same as the first embodiment.

In the modification of the first embodiment, the joining surface between the insulating layers 3b and 5b inside the pierced holes 2 is shifted toward the bottom side of the pierced holes 2a because of the protrusions 1a formed along the pierced hole ends. Consequently, the proportion of the filler contained in the insulating layer 5b inside the pierced holes increases, and that of the filler contained in the insulating layer 3b inside the pierced holes decreases, as compared to conventional cases where the joining surface is not shifted. This improves the heat radiation capability on the bottom side of the pierced holes 2, whereas the heat radiation capability on the top side of the pierced holes 2 lowers.

Moreover, according to the modification of the first embodiment, compression stress occurring due to the difference between the wiring densities of the wiring pattern layers 4 and 6 on the top and bottom sides of the metal substrate 1 (compression stress acting on the top side) causes warpage of the circuit board 10A. This warpage, however, can be reduced by tensile stress that occurs due to a difference in expansion between the insulating layers 3 and 5 on the top and bottom sides of the metal substrate 1 (lateral expansion, in particular). The circuit board 10A reliability can thus be improved by such means as suppressing the occurrence of wiring migration and the exfoliation of the resin insulating layers, and precluding transportation errors when mounting circuit elements and the like.

Hereinafter, description will be given of the tensile stress that occurs from a difference in expansion between the insulating layers 3 and 5 on the top and bottom sides of the metal substrate 1. Tensile stresses (forces with which the insulating layers expand) act between the metal substrate 1 and the insulating layers 3 and 5 because of differences in the coefficient of thermal expansion. Typically, the tensile stress between the metal substrate 1 and the insulating layer 3 and that between the metal substrate 1 and the insulating layer 5 are roughly balanced by each other. The expansion of the insulating layer 5 is suppressed to be smaller than that of the insulating layer 3, however, since it is limited by the anchoring effect of the protrusions 1a, which are formed to anchor into the insulating layer 5. This puts the tensile stresses occurring between the respective insulating layers out of balance, and the circuit board 10A undergoes the difference between the tensile stresses on the insulating layers 3 and 5.

Second Embodiment

Figure 7:
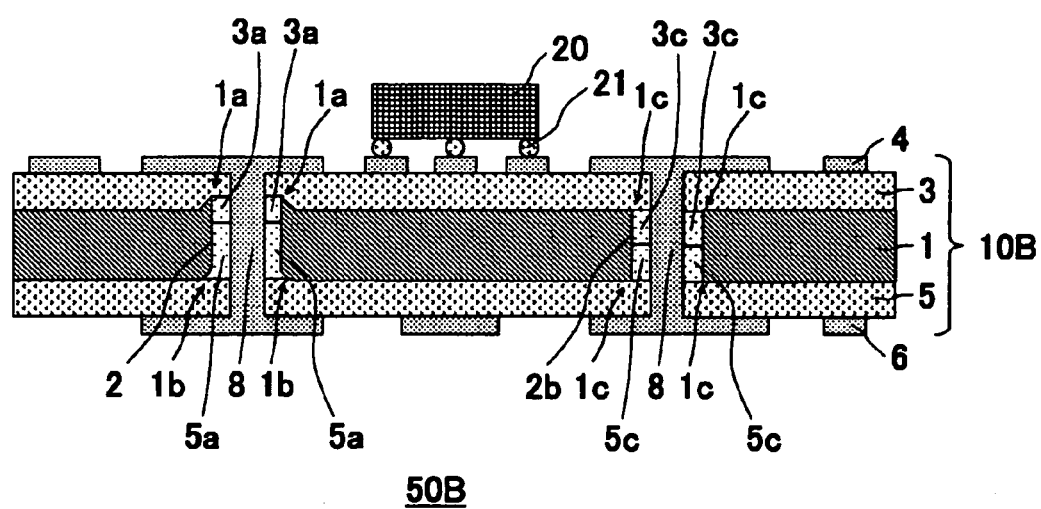
FIG. 7 is a sectional view for explaining the process for manufacturing a circuit apparatus which has a circuit board including a metal substrate according to a second embodiment of the present invention.

FIG. 7 is a sectional view showing a circuit apparatus which has a circuit board including a metal substrate according to a second embodiment of the present invention. A difference from the first embodiment consists in that not all the pierced holes of the metal substrate 1 are provided with protrusions 1a at their ends. That is, some pierced holes 2b (ends 1c) have no protrusion. In all other respects, the circuit apparatus is the same as in the first embodiment.

Even in this second embodiment, the protrusions 1a are formed on some of the pierced hole ends of the metal substrate 1. In those areas, as in the first embodiment, the proportion of the filler contained in the insulating layer 3a inside the pierced holes increases as compared to that of the filler in conventional cases where the joining surface is not shifted. The heat radiation capability of the metal substrate 1 on the top side is thus improved. As a result, it is possible to provide a circuit board 10B having an improved heat radiation capability on the top side of the pierced holes 2 and a circuit apparatus 50B using the same.

Moreover, it is possible to provide a circuit apparatus 50B having an excellent heat radiation capability with efficiency if the pierced holes 2 having the protrusions 1a are arranged around or near the circuit element 20, or heat source.

Third Embodiment

Figure 8:
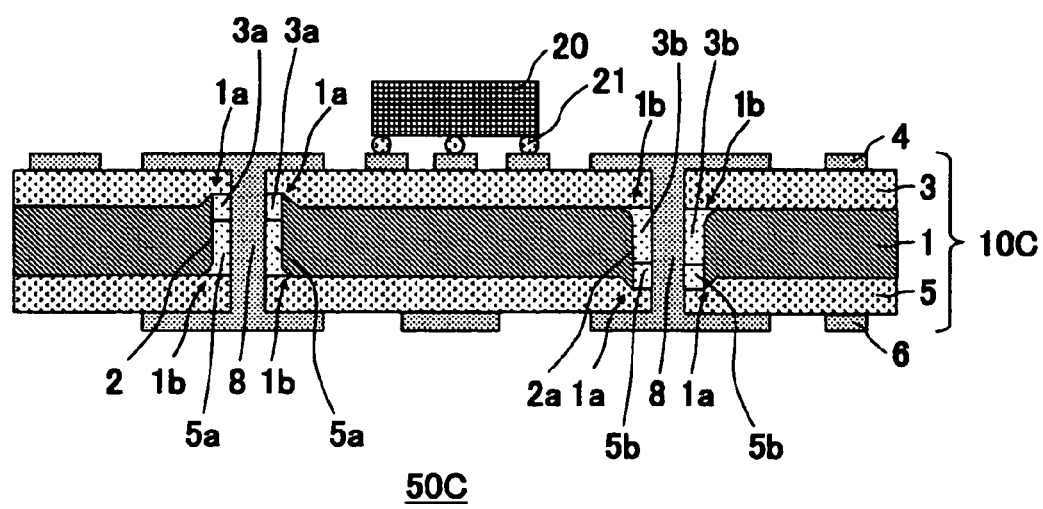
FIG. 8 is a sectional view for explaining the process for manufacturing a circuit apparatus which has a circuit board including a metal substrate according to a third embodiment of the present invention.
Figure 9:
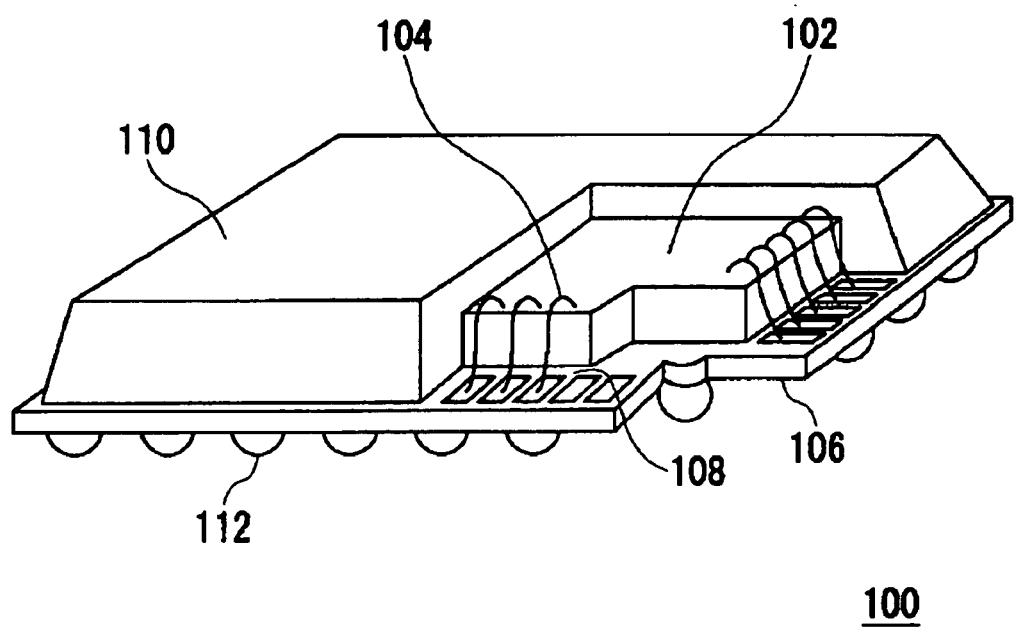
FIG. 9 is a diagram for explaining the general configuration of a conventional typical BGA.
Figure 10:
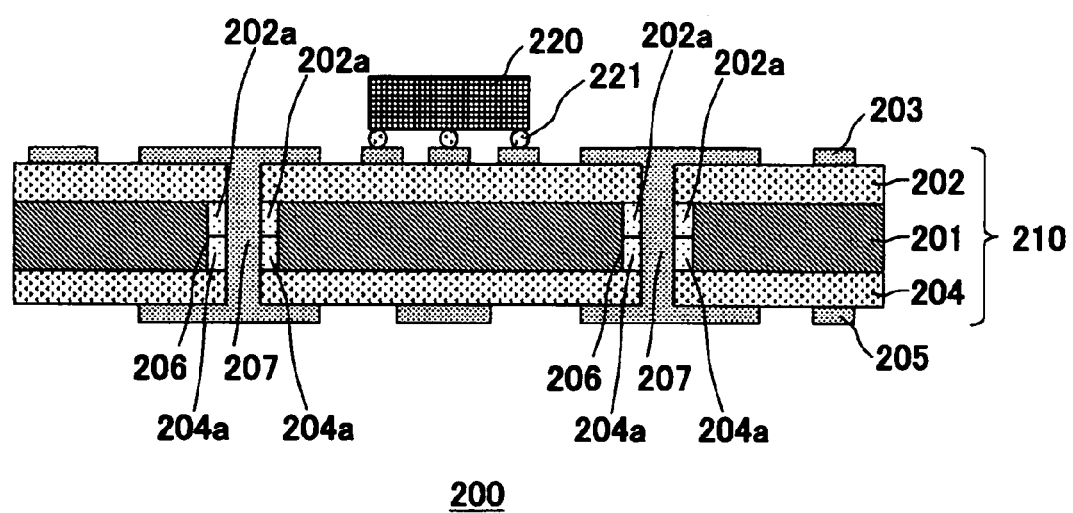
FIG. 10 is a sectional view schematically showing the structure of a circuit apparatus that has a circuit board including a conventional metal substrate.
Figure 11:
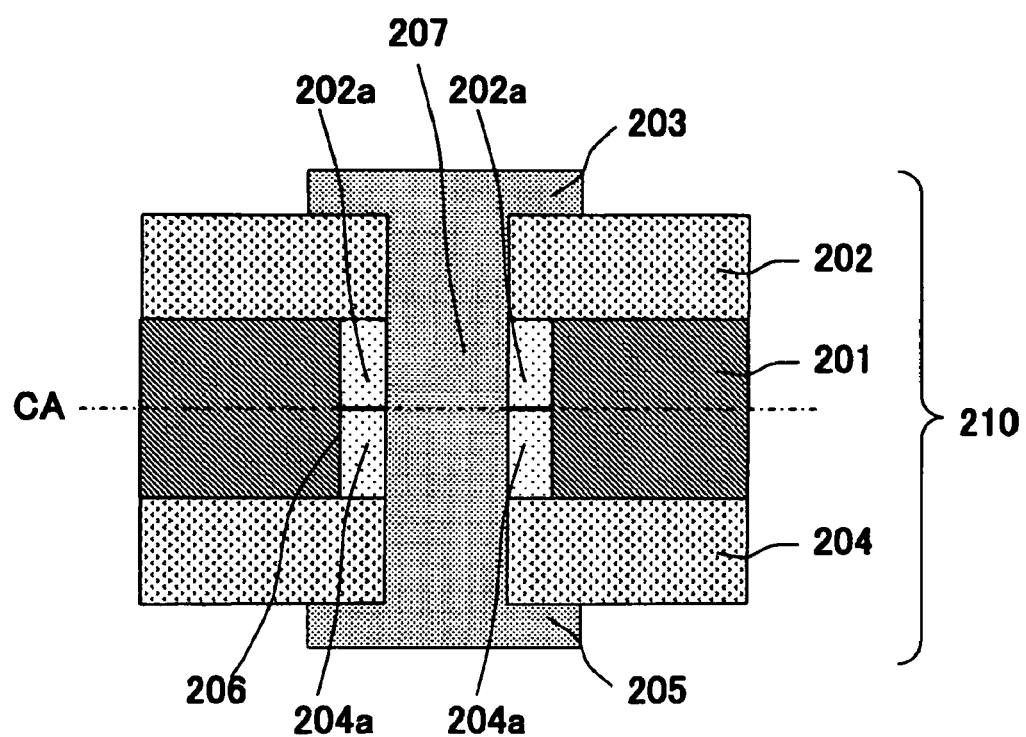
FIG. 11 is an enlarged view near a through hole of the metal substrate in FIG. 10.

FIG. 8 is a sectional view of a circuit apparatus which has a circuit board including a metal substrate according to a third embodiment of the present invention. A difference from the first embodiment consists in that the metal substrate 1 has pierced holes 2 having protrusion 1a on the top side (depressions 1b on the other side) as well as pierced holes 2a having protrusions 1a on the bottom side (depressions 1b on the other side). It should be appreciated that the diagram shows an example where one single protrusion is formed on both the top side and the bottom side of the metal substrate. In fact, pierced holes 2 (with protrusions 1a on the top side) and pierced holes 2a (with protrusions 1a on the bottom side) are arranged in accordance with the mounting position of the circuit element 20 for the purpose of effective heat radiation. In all other respects, the circuit apparatus is the same as in the first embodiment.

According to the third embodiment, the areas of the metal substrate 1, where the pierced holes 2 and 2a having the protrusions 1a are formed, can be selectively improved in heat radiation capability. This makes it possible to efficiently arrange circuit elements 20 on the top and bottom sides of the circuit board, and to provide a circuit apparatus 50C that has a superior heat radiation capability as compared to the cases where the circuit elements are mounted on a circuit board having pierced holes 2 but no protrusion 1a.

In each of the foregoing embodiments, the protrusions 1a are formed on the respective one ends of the pierced holes 2 formed in the metal substrate 1. The joining surface between the insulating layers 3 and 5 is thus shifted to the same side as where the protrusions 1a are, thereby achieving a circuit board having the structure that the filler in the insulating layer 3 lying inside the pierced holes 2 has a filling rate higher than that of the filler in the insulating layer 5 lying inside the pierced holes 2. This structure provides a circuit board 10 or a circuit apparatus 50 that has an improved heat radiation capability on one side of the metal substrate 1. It is therefore possible to effectively radiate heat when the circuit device 20, or heat source, is mounted on the one side of the metal substrate 1. That is, as long as the filler-containing insulating layers have an improved heat radiation capability in the vicinities of the through holes formed through the metal substrate, the protrusions 1a are dispensable and may be replaced with other configurations. For example, the pierced holes 2 may be given a trapezoidal section so that respective one ends of the pierced holes 2 have a diameter smaller than that of the other ends. This suppresses the flow of the insulating layer at the one side of the pierced holes 2, and increases the filler concentration in the insulating layer at the one side of the pierced holes 2.

It should be understood that the embodiments disclosed herein are in all respects illustrative, not restrictive. The scope of the present invention shall be given not by the description of the foregoing embodiments but by the scope of the accompanying claims, and all modifications made within the meanings and scope of equivalency of the claims shall be included therein.

For example, the foregoing embodiments have dealt with the cases where the present invention is applied to a circuit apparatus that is equipped with an LSI chip. The present invention is not limited thereto, however, but may also be applied to circuit apparatuses that are equipped with circuit elements other than LSI chips.

The foregoing embodiments have dealt with the cases where a metal substrate is used. The substrate may be made of resin as long as protrusions can be formed thereon by laser irradiation or drilling.

Furthermore, the foregoing embodiments have dealt with the cases where the present invention is applied to a circuit board of double-layer wiring structure, and a circuit apparatus using the same, in which an insulating layer and a wiring layer are formed in succession on both sides of the metal substrate. The present invention is not limited thereto, however, but may also be applied to circuit boards, and circuit apparatuses using the same, in which one or more additional insulating layers and wiring layers are formed on the wiring layers of the circuit board that has the double-layer wiring structure.

What is claimed is:

1. A circuit board comprising:
   a substrate having a pierced hole;
   a first wiring layer formed on one side of the substrate via a first insulating layer containing an insulator and a filler having a thermal conductivity higher than that of the insulator;
   a second wiring layer formed on the other side of the substrate via a second insulating layer having the same composition as that of the first insulating layer;

a conductor layer piercing through the substrate via the pierced hole, thereby establishing connection between the first wiring layer and the second wiring layer; and a protrusion formed on the one side of the substrate along an end of said pierced hole, and wherein a joining surface between the first insulating layer and the second insulating layer in the pierced hole is shifted toward the same side as where the protrusion is formed.

2. The circuit board according to claim 1, wherein the substrate further has a round corner on the other side of the pierced hole having a protrusion, the round corner being formed along the end of the pierced hole.

3. The circuit board according to claim 1, wherein the substrate further has a pierced hole having no protrusion.

4. The circuit board according to claim 1, wherein the substrate further has a pierced hole having a protrusion on the other side of the substrate.

5. The circuit board according to claim 1, wherein a filling rate of the filler in the first wiring layer inside the pierced hole is higher than that of the filler in the second wiring layer inside the pierced hole.

6. A circuit apparatus comprising:
the circuit board according to claim 1; and
a circuit element mounted on the circuit board, the circuit element being arranged on the first wiring layer which is formed on the same one side as the protrusion is.

7. A circuit apparatus comprising:
the circuit board according to claim 2; and
a circuit element mounted on the circuit board, the circuit element being arranged on the first wiring layer which is formed on the same one side as the protrusion is.

8. A circuit apparatus comprising:
the circuit board according to claim 3; and
a circuit element mounted on the circuit board, the circuit element being arranged on the first wiring layer which is formed on the same one side as the protrusion is.

9. A circuit apparatus comprising:
the circuit board according to claim 4; and
a circuit element mounted on the circuit board, the circuit element being arranged on the first wiring layer which is formed on the same one side as the protrusion is.

10. A circuit apparatus comprising:
the circuit board according to claim 5; and
a circuit element mounted on the circuit board, the circuit element being arranged on the first wiring layer which is formed on the same one side as the protrusion is.

11. A circuit board comprising:
a substrate having a pierced hole;
a first wiring layer formed on one side of the substrate via a first insulating layer containing an insulator and a filler having a thermal conductivity higher than that of the insulator;
a second wiring layer formed on the other side of the substrate via a second insulating layer having the same composition as that of the first insulating layer; and
a conductor layer piercing through the substrate via the pierced hole, thereby establishing connection between the first wiring layer and the second wiring layer, and wherein
a joining surface between the first insulating layer and the second insulating layer in the pierced hole is shifted toward the one side of the substrate where the first insulating layer is formed, and
a filling rate of the filler in the first wiring layer inside the pierced hole is higher than that of the filler in the second wiring layer inside the pierced hole.

12. A circuit apparatus comprising:
the circuit board according to claim 11; and
a circuit element mounted on the circuit board, the circuit element being mounted on the first wiring layer.

* * * * *